US008618718B2

(12) United States Patent
Qu et al.

(10) Patent No.: US 8,618,718 B2
(45) Date of Patent: Dec. 31, 2013

(54) TRANSDUCER

(75) Inventors: Jinli Qu, Singapore (SG); Ming Lin Julius Tsai, Singapore (SG); Bo Woon Jeffrey Soon, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 112 days.

(21) Appl. No.: 13/200,425

(22) Filed: Sep. 22, 2011

(65) Prior Publication Data

US 2012/0104898 A1 May 3, 2012

(30) Foreign Application Priority Data

Sep. 22, 2010 (SG) .................... 201006909-4

(51) Int. Cl.
*H01L 41/08* (2006.01)

(52) U.S. Cl.
USPC .......................... 310/328; 310/330

(58) Field of Classification Search
USPC .......................... 310/328, 330–332
See application file for complete search history.

(56) References Cited

U.S. PATENT DOCUMENTS

| 6,978,032 | B2 | 12/2005 | Ogura et al. | |
|---|---|---|---|---|
| 7,554,248 | B2 | 6/2009 | Oda et al. | |
| 7,656,071 | B2 * | 2/2010 | Mehta | 310/324 |
| 2004/0075364 | A1 | 4/2004 | Mehta | |
| 2005/0194867 | A1 * | 9/2005 | Kawakubo et al. | 310/348 |
| 2007/0012112 | A1 * | 1/2007 | Kim | 73/594 |
| 2007/0209176 | A1 * | 9/2007 | Kawakubo et al. | 29/25.35 |
| 2007/0278900 | A1 * | 12/2007 | Kawakubo et al. | 310/328 |
| 2009/0069686 | A1 | 3/2009 | Daft et al. | |
| 2009/0284102 | A1 | 11/2009 | Karakaya et al. | |
| 2011/0074248 | A1 * | 3/2011 | Hishinuma | 310/330 |

FOREIGN PATENT DOCUMENTS

WO WO 2009/016606 2/2009

OTHER PUBLICATIONS

Jinli Qu, et al., "Analysis of Active Damping of a Silicon Microphone Using a Linear Controller", American Control Conference.
X Chen, et al., "Modelling of a tunable capacitor with piezoelectric actuation", J. Micromech. Microeng. 14 S102 (2004).
A. Faiz, et al., "A new adaptive resonance frequency of piezoelectric components used for vibration damping", J. Acoust. Soc. Am. vol. 127, Issue 4, pp. EL134-EL139 (2010).
Roche et al., "Control of a Drop Ejector used as a photoresist dispenser", SPIE Conference on Mathematics and Control in Smart Structures (1998).

* cited by examiner

*Primary Examiner* — Mark Budd
(74) *Attorney, Agent, or Firm* — K. David Crockett, Esq.; Niky Economy Syrengelas, Esq.; Crockett & Crockett, PC

(57) ABSTRACT

According to embodiments of the present invention, a transducer is provided. The transducer includes a first electrode, a second electrode disposed over the first electrode such that the first electrode and the second electrode form respective capacitive electrodes of a capacitor, the second electrode comprising a core portion and a peripheral portion, a third electrode disposed relative to the second electrode such that the third electrode overlaps with the peripheral portion of the second electrode, and a piezoelectric element disposed between the peripheral portion of the second electrode and the third electrode, so as to tune a tensional force provided by the piezoelectric element onto the second electrode by varying a piezoelectric voltage applied between the second electrode and the third electrode.

20 Claims, 10 Drawing Sheets

1

TRANSDUCER

This application claims the benefit of priority of Singapore patent application No. 201006909-4, filed 22 Sep. 2010, the content of it being hereby incorporated by reference in its entirety for all purposes.

FIELD OF THE INVENTIONS

Various embodiments relate to a transducer.

BACKGROUND OF THE INVENTIONS

Due to the ability of integration with complementary metal-oxide-semiconductor (CMOS) circuitry, wide bandwidth and highly compact size, the micro-machined capacitive transducers have been widely developed as condenser microphones, accelerometers, pressure sensors and ultrasound devices, etc. However, the performance of these capacitive transducers may be limited by the intrinsic physical laws.

Capacitive transducers with parallel-plate structure most often suffer design trade-offs such as bandwidth and mechanical sensitivity (e.g. for sensors), thermal noise and passive damping (e.g. for sensors), output power and collapse voltage (e.g. for actuators), etc., which result from the non-linearity of the electrostatic force. Furthermore, the intrinsic properties of the electrostatic force may generate "stiffness softening" effect and results in a collapsed structure when the restoring stiffness force fails to maintain or counter the increasing electrostatic force. The occurrence of collapse for parallel-plate capacitive transducers limits their performance.

For the design trade-off between the transducers' bandwidth and their mechanical sensitivity, in order to expand their bandwidth, the transducers need to be less compliant, which results in the mechanical sensitivity dropdown. Moreover, the compliance of the transducers may also affect the value of restoring force to balance the electrostatic force applied. In the case of capacitive transducers with parallel plate structure, the electrostatic force "softens" the structure of transducers and cause the transducer structures to collapse when the electrostatic force becomes greater than the restoring force that the structures are able to provide. The collapse of the capacitive transducers is then decided by the bias voltage and the gap size between their electrodes. The higher the bias voltage, the transducers may have higher electrical sensitivity but become more likely to collapse. The situation may be worse when designing capacitive actuators. Capacitive actuators generally have a narrower gap size for higher electrostatic energy density, which, however is limited by the ability to avoid a collapse.

Another specification of the capacitive transducers is the mechanical noise floor, generally believed to be determined by their passive damping coefficient. The smaller the damping, the lower the noise floor becomes. However, lightly damped transducers may display deteriorated dynamic performance and results in the failure of the transducers' design.

For a transducer array, the sensitivity tolerance between each transducer cell is critical for the performance of the array. Due to the fabrication issues, there are variations in the mechanical sensitivity of the micro-machined capacitive transducers, which often shows ±1 dB to ±2 dB sensitivity tolerance for the commercial products.

The preceding design trade-offs have become major limitations in improving the capacitive transducers' performance. In addition, conventional transducers employ capacitive tuning where tuning is limited in a single direction, or magnetic tuning which requires a complex transducer structure.

SUMMARY

According to an embodiment, a transducer is provided. The transducer may include a first electrode, a second electrode disposed over the first electrode such that the first electrode and the second electrode form respective capacitive electrodes of a capacitor, the second electrode comprising a core portion and a peripheral portion, a third electrode disposed relative to the second electrode such that the third electrode overlaps with the peripheral portion of the second electrode, and a piezoelectric element disposed between the peripheral portion of the second electrode and the third electrode, so as to tune a tensional force provided by the piezoelectric element onto the second electrode by varying a piezoelectric voltage applied between the second electrode and the third electrode.

According to an embodiment, a transducer is provided. The transducer may include a first electrode, a second electrode disposed over the first electrode such that the first electrode and the second electrode form respective capacitive electrodes of a capacitor, the second electrode comprising a core portion and a peripheral portion, and a piezoelectric element disposed between the peripheral portion of the second electrode and the first electrode, so as to tune a tensional force provided by the piezoelectric element onto the second electrode by varying a piezoelectric voltage applied between the first electrode and the second electrode.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION OF THE INVENTIONS

Figure 1A:
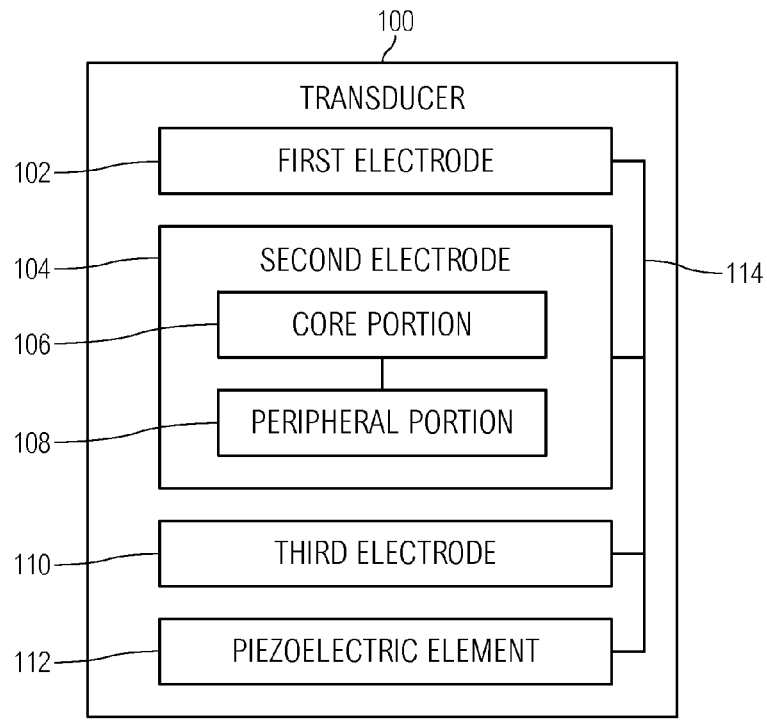
FIG. 1A shows a schematic block diagram of a transducer, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

In the context of various embodiments, it should be appreciated that embodiments described in the context of one of the devices may be analogously valid for the other device or devices.

In the context of various embodiments, the phrase "at least (substantially)" may include "exactly" and a variance of ±5% thereof. As an example and not limitations, "A is at least substantially same as B" may encompass embodiments where A is exactly the same as B, or where A may be within a variance of ±5%, for example of a value, of B, or vice versa.

In the context of various embodiments, the term "about" or "approximately" as applied to a value may encompass the exact value and a variance of ±5% of the value.

Various embodiments provide capacitive transducers or micro-machined capacitive transducers, with piezoelectric tuning. Piezoelectric tuning may be carried out, for example, by tuning the piezoelectric voltage applied.

In various embodiment, the transducers may have a capacitive parallel-plate structure of two electrodes, which provides structure simplicity and thermal stability, with a piezoelectric element stacked over the electrodes or between the electrodes, and positioned at least substantially around the structure's circumferential boundary or peripheral portion. One of the capacitive electrodes of the parallel-plate capacitor structure may be flexible and/or movable, and may be a membrane. When activated, the piezoelectric element may stretch the capacitive membrane. By controlling the tensional force, the piezoelectric element may adjust the capacitive membrane's stiffness and overall damping. The manner in which the tensional force is applied may allow control of the stiffness tuning, damping tuning and sensitivity matching, among others.

In various embodiments, piezoelectric tuning may provide an efficient way of implementating tuning, such as stiffness tuning and damping tuning, through adjusting the tensional force to the structural membrane. Piezoelectric tuning may also provide more freedom on designing high-performance micro-machined capacitive transducers through stiffness tuning and active damping tuning.

In various embodiments, the stiffness tuning and/or the active damping tuning may be static tuning and/or dynamic tuning. In the context of various embodiments, the term "static tuning" may mean adjusting or tuning the DC voltage applied to the piezoelectric electrodes, while the term "dynamic tuning" may mean online adjusting or tuning the AC voltage applied to the piezoelectric electrodes dynamically, for example according to control laws. These tuning abilities may give the capacitive transducers the advantages of high power output efficiency, improved sensitivity and significantly low noise floor. The piezoelectric tuning scheme may benefit capacitive transducers with parallel plates such as but not limited to condenser microphones, ultrasound transducers, micro-speakers, accelerometers and pressure sensors.

In various embodiments, by providing the piezoelectric element on the circumferential boundary of the electrode or electrode membrane, rather than over a larger surface area of the membrane such as for example over the entire surface area, there is minimal interference to the movement of the membrane and therefore the performance of the transducer may not be adversely affected. In other words, by disposing the piezoelectric element on the circumferential boundary of the electrode membrane, a large area of the electrode membrane remains exposed with minimal interference on its movement.

Various embodiments of the transducers or capacitive transducers incorporate an additional physical mechanism in the form of piezoelectric tuning. Compared to conventional transducers, the piezoelectric structure may show more freedom in the directions of actuation and improved power output efficiency. By combining piezoelectric layers or elements with capacitive transducers, the piezoelectric transducers of various embodiments may be able to overcome the design trade-offs of conventional transducers, and therefore improve the transducers' performances beyond the limitations of the design trade-offs. In various embodiments, the piezoelectric elements are placed peripherally over the boundary of the capacitive electrodes, either between the electrode plates or on top of (or over) the top electrode plate.

Various embodiments of the piezoelectric transducers are capacitive and employ electrostatic laws to achieve sensing or actuation functions. The piezoelectric layer or element provides the piezoelectric tuning ability, for example in the form of stiffness tuning and active damping tuning, in order to improve or optimize the overall transducers' performance in a balanced design.

Various embodiments may provide capacitive transducers incorporating piezoelectric tuning for increasing the sensitivity while maintaining the bandwidth, having low sensitivity variations and high radiation pressure output. Piezoelectric tuning may be implemented with but not limited to microphones, pressure sensors and capacitive micromachined ultrasound transducers (cMUTs).

Various embodiments may provide capacitive transducers incorporating piezoelectric tuning that may provide higher power output, higher mechanical sensitivity, lower noise with active damping and sensitivity matching compared to conventional transducers or solely capacitive transducers. In addition, the capacitive transducers with piezoelectric tuning of various embodiments may have an ultra-low thermal noise for capacitive sensors without increasing the dimensions of the sensors. In other words, the capacitive transducers of various embodiments, with piezoelectric tuning including active damping, may help to decrease the thermal noise while enabling the transducers to maintain a small dimension. In contrast, conventional capacitive transducers have a large dimension in order to keep the thermal noise low as thermal noise is inversely related to the dimensions of the transducers/sensors.

The transducers of various embodiments may be formed on a substrate, for example a silicon substrate or wafer or a silicon-on-insulator (SOI) substrate having a layer of dielectric.

Various embodiments of the transducer provide a simple structure at a low cost with improved performance, and may be fabricated using MEMS processing.

In order that the invention may be readily understood and put into practical effect, particular embodiments will now be described by way of examples and not limitations, and with reference to the figures.

FIG. 1A shows a schematic block diagram of a transducer 100, according to various embodiments. The transducer 100 includes a first electrode 102, a second electrode 104 disposed over the first electrode 102 such that the first electrode 102 and the second electrode 104 form respective capacitive electrodes of a capacitor, the second electrode 104 including a core portion (or core region) 106 and a peripheral portion (or peripheral region) 108, a third electrode 110 disposed relative to the second electrode 104 such that the third electrode 110 overlaps with the peripheral portion 108 of the second electrode 104 and a piezoelectric element 112 disposed between the peripheral portion 108 of the second electrode 104 and the third electrode 110, so as to tune a tensional force provided by the piezoelectric element 112 onto the second electrode 104 by varying a piezoelectric voltage applied between the second electrode 104 and the third electrode 110. The third electrode 110 and/or the piezoelectric element 112 may have a shape or geometrical configuration that is at least substantially same as that of the peripheral portion 108 of the second electrode 104.

The tensional force provided by the piezoelectric element 112 onto the second electrode 104 may be in a direction substantially perpendicular to the direction of the piezoelectric voltage applied between the second electrode 104 and the third electrode 110. This may provide vertical capacitive driving. The tensional force may include a tensile strain.

In various embodiments, the first electrode 102 and the second electrode 104 may be configured to be substantially parallel to each other. In various embodiments, the second electrode 104 may be disposed over the first electrode 102 such that at least a portion of the first electrode 102 and at least a portion of the second electrode 104 may be separated by an air gap or vacuum.

In FIG. 1A, the line represented as 114 illustrates the relationship between the different components, which may include electrical coupling and/or mechanical coupling.

Figure 1B:
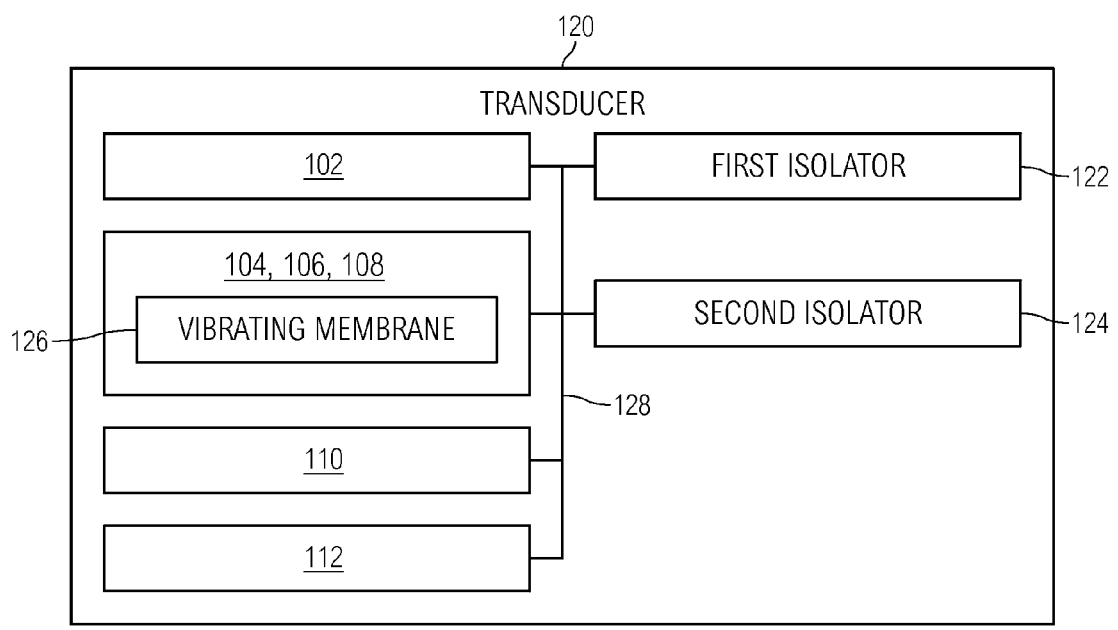
FIG. 1B shows a schematic block diagram of a transducer, according to various embodiments.

FIG. 1B shows a schematic block diagram of a transducer 120, according to various embodiments. The transducer 120 includes a first electrode 102, a second electrode 104 including a core portion 106 and a peripheral portion 108, a third electrode 110 and a piezoelectric element 112, which may be similar to the embodiment as described in the context of FIG. 1A.

In various embodiments, the first electrode 102 may be positioned substantially along the same plane as the third electrode 110.

In various embodiments, the transducer 120 may further include a first isolator or insulator 122 disposed between the first electrode 102 and the third electrode 110. The first electrode 102 may include a cross-sectional dimension smaller than the second electrode 104.

In various embodiments, the transducer 120 may further include a second isolator or insulator 124 disposed between the first electrode 102 and the second electrode 104. The first electrode 102 may include a cross-sectional dimension substantially similar to the second electrode 104. In various embodiments, each of the first electrode 102, the second electrode 104 and the third electrode 110 may be positioned in substantially different planes.

In various embodiments, the second electrode 104 may include or may be a vibrating membrane (also known as capacitive membrane) 126, which is movable or stretchable. In various embodiments, the piezoelectric element 112 may be disposed between the peripheral portion 108 of the second electrode 104 and the third electrode 110 so as to minimize interference to movement of the second electrode 104.

In FIG. 1B, the line represented as 128 illustrates the relationship between the different components, which may include electrical coupling and/or mechanical coupling.

Figure 1C:
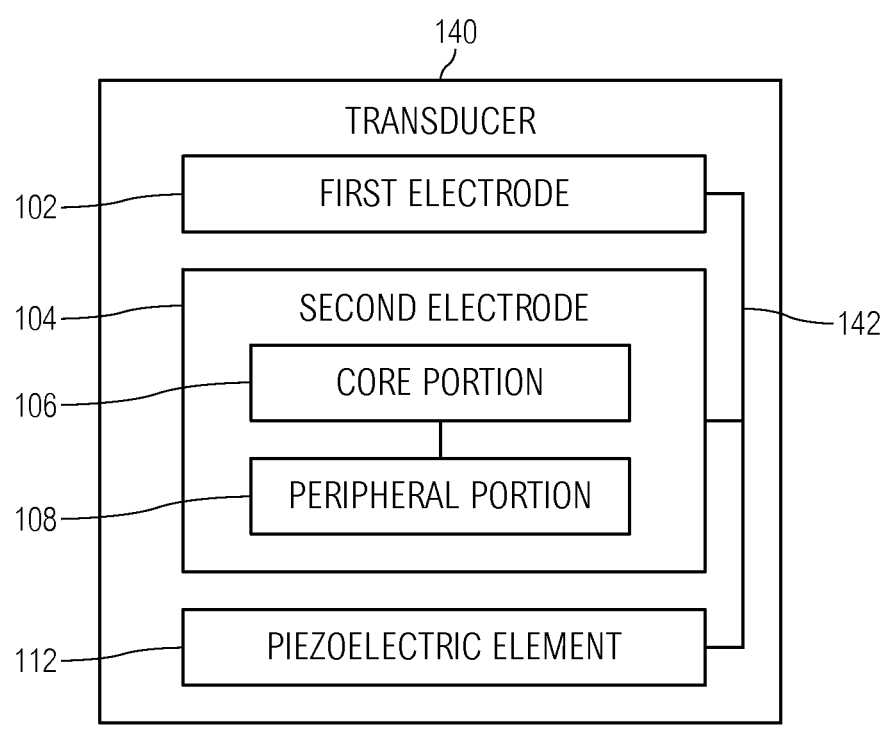
FIG. 1C shows a schematic block diagram of a transducer, according to various embodiments.

FIG. 1C shows a schematic block diagram of a transducer 140, according to various embodiments. The transducer 140 includes a first electrode 102, a second electrode 104 disposed over the first electrode 102 such that the first electrode 102 and the second electrode 104 form respective capacitive electrodes of a capacitor, the second electrode 104 including a core portion 106 and a peripheral portion 108, and a piezoelectric element 112 disposed between the peripheral portion 108 of the second electrode 104 and the first electrode 102, so as to tune a tensional force provided by the piezoelectric element 112 onto the second electrode 104 by varying a piezoelectric voltage applied between the first electrode 102 and the second electrode 104. The piezoelectric element 112 may have a shape or geometrical configuration that is at least substantially same as that of the peripheral portion 108 of the second electrode 104.

In various embodiments, the second electrode 104 may include or may be a vibrating membrane (also known as capacitive membrane).

In FIG. 1C, the line represented as 142 illustrates the relationship between the different components, which may include electrical coupling and/or mechanical coupling.

In the context of various embodiments, the transducer 100, 120, 140 may be configured to perform a capacitive transduction when a capacitive voltage is applied between the first electrode 102 and the second electrode 104.

In the context of various embodiments, the piezoelectric element 112 may include a material selected from a group consisting of Aluminum Nitride (AlN), Lead Zironate Titanate (PZT), Polyvinylidene Fluoride (PVDF), and Zinc Oxide (ZnO).

In the context of various embodiments, each of the first electrode 102, the second electrode 104 and the third electrode 110 may include a metal selected from a group consisting of Aluminum (Al), Titanium (Ti), Chromium (Cr) and Molybdenum (Mo).

In the context of various embodiments, each of the first electrode 102, the second electrode 104 and the third electrode 110 may include doped polycrystalline silicon or single crystalline silicon.

In the context of various embodiments, each of the first isolator 122 and the second isolator 124 may include a material selected from a group consisting of silicon carbide (SiC) and silicon oxide ($SiO_2$).

In the context of various embodiments, the respective dimension of the first electrode 102, the second electrode 104, the third electrode 110, the first isolator 122, the second isolator 124 and the piezoelectric element 112 may depend on the type of transducers and the applications.

In various embodiments, the piezoelelectric element 112 may have a thickness in a range of between about 0.1 μm and about 2 μm, for example a range of between about 0.5 μm and about 1.5 μm or a range of between about 0.8 μm and about 1.2 μm, and a size in a range of between about 50 μm and about 1000 μm, for example a range of between about 200 μm and about 800 μm or a range of between about 400 μm and about 600 μm.

In various embodiments, each of the first isolator 122 and the second isolator 124 may have a width in a range of between about 1 μm and about 4 μm, for example a range of between about 1.5 μm and about 3.5 μm or a range of between about 2 μm and about 3 μm.

In the context of various embodiments, the respective size of the transducers 100, 120, 140, may be in a range of between about 50 μm and about 2 mm (2000 μm), for example a range of between about 100 μm and about 1.5 mm or a range of between about 500 μm and about 1 mm, depending on the applications. In various embodiments, the respective transducers 100, 120, 140, may have a circular shape, a square shape or a rectangular shape, where the size may refer to the cross-sectional dimension/size. Where any of the transducers 100, 120, 140, has a circular shape, the size may refer to the diameter of the transducer.

In the context of various embodiments, the term "capacitor electrodes" mean electrodes that define a capacitor and used for capacitive transduction.

In the context of various embodiments, the term "piezoelectric electrodes" mean electrodes that are used for piezoelectric tuning. In various embodiments, one or more electrodes may be common as part of both the capacitor electrodes and piezoelectric electrodes. In other words, one or more electrodes may be used for both capacitive transduction and piezoelectric tuning.

In the context of various embodiments, a capacitive voltage may be applied to the capacitor electrodes such that the transducer may perform capacitive transduction. The capacitive voltage may include a DC bias voltage and an AC voltage applied to the capacitor electrodes to sense the movement of the electrode or electrode membrane through a capacitance change or to drive the movement of the electrode or electrode membrane.

In the context of various embodiments, a piezoelectric voltage may be applied to the piezoelectric electrodes for piezoelectric tuning of the transducer. In other words, piezoelectric tuning of the transducer may be carried out by changing the piezoelectric voltage. The piezoelectric voltage may be a DC voltage applied to the piezoelectric electrodes to actuate the piezoelectric electrodes to generate a stretching force on an electrode or electrode membrane for stiffness tuning. For active damping tuning, the piezoelectric voltage may include a DC voltage and/or an AC voltage.

Figure 2A:
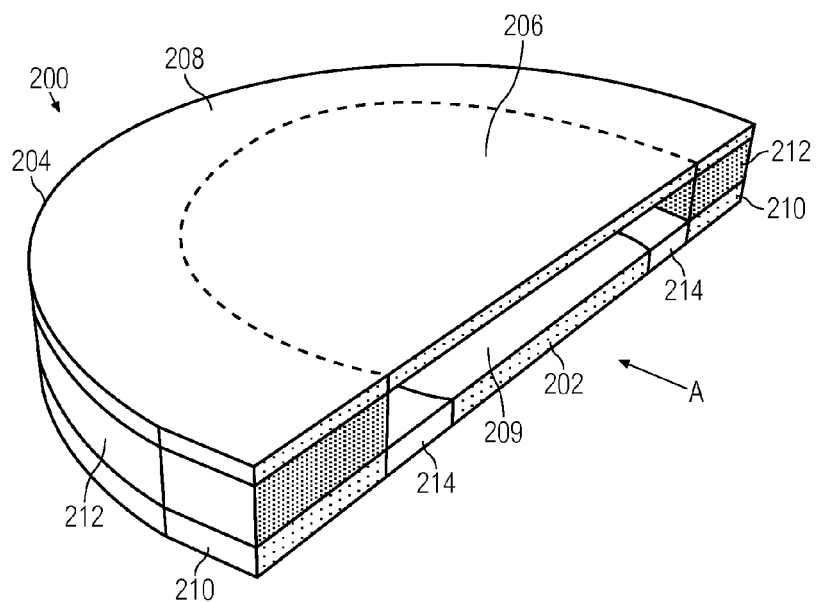
FIG. 2A shows a partial perspective view of a transducer, according to various embodiments.
Figure 2B:
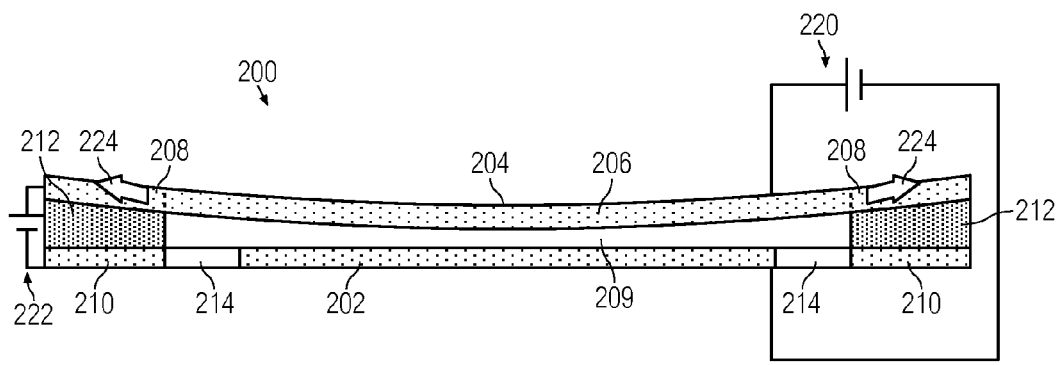
FIG. 2B shows a cross-sectional view of the transducer of the embodiment of FIG. 2A, as viewed in the direction A.

FIG. 2A shows a partial perspective view of a transducer 200, according to various embodiments. FIG. 2B shows a cross-sectional view of the transducer 200 of the embodiment of FIG. 2A, as viewed in the direction A, during pieozoelectric tuning. It should be appreciated that FIG. 2A shows one half of the transducer 200. In other words, the transducer 200 has a circular structure of continuous configuration of the half structure as illustrated in FIG. 2A adjoining a mirror image of the half structure of FIG. 2A. However, it should be appreciated that the transducer 200 may have other structural shapes, for example a square structure or a rectangular structure.

The transducer 200 includes a first electrode 202 and a second electrode 204 disposed over the first electrode 202, where the first electrode 202 and the second electrode 204 form respective capacitive electrodes of a capacitor. The first electrode 202 has a cross-sectional dimension smaller than the second electrode 204.

The second electrode 204 has a continuous structure, where a part of it may be defined as a core portion 206 and the remaining part defined as a peripheral portion 208.

As shown in FIGS. 2A and 2B, the first electrode 202 and at least a portion (e.g. the core portion 206) of the second electrode 204 are separated by a gap 209, for example an air gap or vacuum.

The transducer 200 further includes a third electrode 210 disposed relative to the second electrode 204 such that the third electrode 210 overlaps with the peripheral portion 208 of the second electrode 204. The third electrode 210 has a shape or geometrical configuration that is at least substantially similar to that of the peripheral portion 208 of the second electrode 204.

As shown in FIG. 2A, the first electrode 202 and the second electrode 204 are at least substantially parallel to each other, when no piezoelectric tuning is carried out. In addition, the second electrode 204 and the third electrode 210 are at least substantially parallel to each other, when no piezoelectric tuning is carried out.

The transducer 200 further includes a piezoelectric element 212 disposed between the peripheral portion 208 of the second electrode 204 and the third electrode 210. In other words, the piezoelectric element 212 is placed peripherally over the boundary of the second electrode 204 and the third electrode 210, in between the second electrode 204 and the third electrode 210. The piezoelectric element 212 may have a shape or geometrical configuration that is at least substantially similar to that of the peripheral portion 208 of the second electrode 204. The piezoelectric element 212 has a thickness equivalent to the gap size or distance between the capacitive parallel electrodes (i.e. the second electrode 204 and the third electrode 210).

The piezoelectric element 212 may provide a tensional force onto the second electrode 204, where the tensional force may be tuned or varied by varying a piezoelectric voltage applied between the second electrode 204 and the third electrode 210.

The tensional force (which may include a tensile strain) is in a direction substantially perpendicular to the direction of the piezoelectric voltage applied between the second electrode 204 and the third electrode 210.

The transducer 200 further includes an isolator 214 disposed between the first electrode 202 and the third electrode 210. While not clearly shown, the isolator 214 is configured to at least substantially surround the first electrode 202. Therefore, the third electrode 210 is isolated or separated from the first electrode 202 by the isolator 214.

As shown in FIGS. 2A and 2B, the first electrode 202, the isolator 214 and the third electrode 210 are positioned at least substantially along the same plane.

In various embodiments, the first electrode 202 and the second electrode 204 are capacitive electrodes configured for capacitive transduction, while the second electrode 204 and the third electrode 210 are piezoelectric electrodes configured for piezoelectric tuning. Therefore, the second electrode 204 functions as both a capacitive electrode and a piezoelectric electrode, relative to the first electrode 202 and the third electrode 210 respectively.

As shown in FIG. 2B, a first energy source 220 may be provided in electrical communication with the first electrode 202 and the second electrode 204, for example to provide a capacitive voltage such that the transducer 200 may perform capacitive transduction. In addition, a second energy source 222 may be provided in electrical communication with the third electrode 210 and the second electrode 204, for example to provide a piezoelectric voltage such that the piezoelectric element 212 generates an electro-mechanical coupling effect during piezoelectric tuning. During piezoelectric tuning of the transducer 200, the piezoelectric element 212 may provide a stretching force, as represented by the directional arrows 224, on the second electrode 204, or a compressive force.

The first energy source 220 and the second energy source 222 provide the same electrical potential to the second electrode 204, while the respective electrical potential of the first electrode 202 and the third electrode 210 may be the same or different from each other.

Figure 3A:
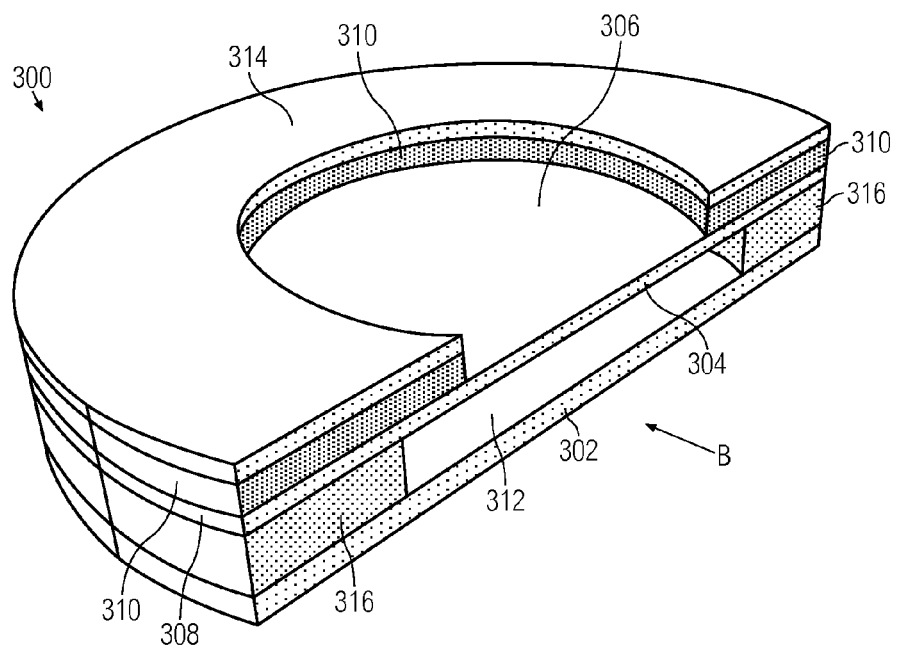
FIG. 3A shows a partial perspective view of a transducer, according to various embodiments.

FIG. 3A shows a partial perspective view of a transducer 300, according to various embodiments. It should be appreciated that FIG. 3A shows one half of the transducer 300. In other words, the transducer 300 has a circular structure of continuous configuration of the half structure as illustrated in FIG. 3A adjoining a mirror image of the half structure of FIG. 3A. However, it should be appreciated that the transducer 300 may have other structural shapes, for example a square structure or a rectangular structure.

The transducer 300 includes a first electrode 302 and a second electrode 304 disposed over the first electrode 302, where the first electrode 302 and the second electrode 304 form respective capacitive electrodes of a capacitor. The first electrode 302 has a cross-sectional dimension substantially similar to the second electrode 304.

The second electrode 304 has a continuous structure, where a part of it may be defined as a core portion 306 and the remaining part defined as a peripheral portion 308, where the peripheral portion 308 is the portion beneath a piezoelectric element 310 and overlapping with the piezoelectric element 310.

The transducer 300 further includes a third electrode 314 disposed relative to the second electrode 304 such that the third electrode 314 overlaps with the peripheral portion 308 of the second electrode 304. The third electrode 314 has a shape or geometrical configuration that is at least substantially similar to that of the peripheral portion 308 of the second electrode 304.

As shown in FIG. 3A, the first electrode 302, the second electrode 204 and the third electrode 314 are at least substantially parallel to each other, when no piezoelectric tuning is carried out.

In the transducer 300, the piezoelectric element 310 is disposed between the peripheral portion 308 of the second electrode 304 and the third electrode 314. In other words, the piezoelectric element 310 is placed peripherally over the boundary of the second electrode 304 and the third electrode 314, in between the second electrode 304 and the third electrode 314. The piezoelectric element 310 may have a shape or geometrical configuration that is at least substantially similar to that of the peripheral portion 308 of the second electrode 304. The piezoelectric element 310 has a thickness equivalent to the gap size or distance between the piezoelectric electrodes (i.e. the second electrode 304 and the third electrode 314).

The piezoelectric element 310 may provide a tensional force onto the second electrode 304, where the tensional force may be tuned or varied by varying a piezoelectric voltage applied between the second electrode 304 and the third electrode 314.

The tensional force (which may include a tensile strain) is in a direction substantially perpendicular to the direction of the piezoelectric voltage applied between the second electrode 304 and the third electrode 314.

The transducer 300 further includes an isolator 316 disposed between the first electrode 302 and the second electrode 304. The isolator 316 may have a shape or geometrical configuration that is at least substantially similar to that of the peripheral portion 308 of the second electrode 304 and/or the third electrode 314.

Figure 3B:
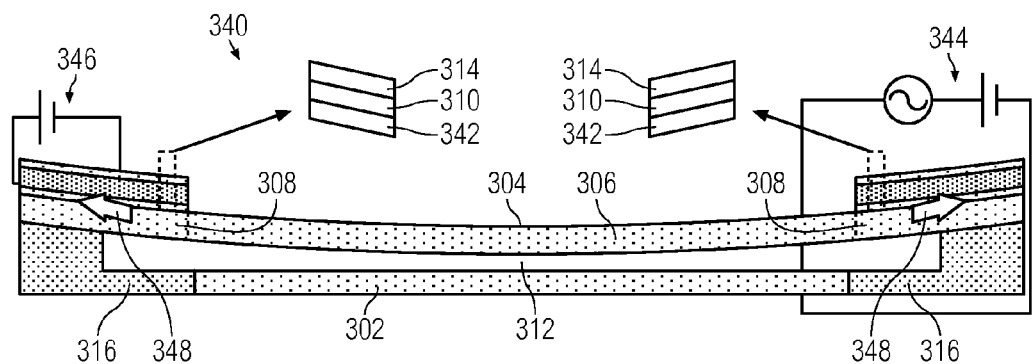
FIG. 3B shows a cross-sectional view of a transducer, according to various embodiments.

FIG. 3B shows a cross-sectional view of a transducer 340, according to various embodiments. The transducer 340 is substantially similar to the transducer 300 of FIG. 3A, with some structural differences for illustration of different embodiments, as viewed in the direction B, during piezoelectric tuning. The transducer 340 may have a circular structure, a square structure or a rectangular structure.

The transducer 340 may include the isolator 316 that extends to and along the plane of the first electrode 302 such that the first electrode 302 has a cross-sectional dimension smaller than the second electrode 304.

In addition, the transducer 340 may include a fourth electrode 342 disposed between the second electrode 304 and the piezoelectric element 310. The fourth electrode 342 may have a shape or geometrical configuration that is at least substantially similar to that of the peripheral portion 308 of the second electrode 304 and/or the piezoelectric element 310. The fourth electrode 342 may be a metal electrode. The fourth electrode 342 may serve a similar function as that of the second electrode 304. Therefore, a piezoelectric structure may be provided, having a sandwiched structure with the piezoelectric element 310 provided or bonded in between the third electrode 314 and the fourth electrode 342. In the context of various embodiments, the fourth electrode 342 may include a metal selected from a group consisting of Aluminum (Al), Titanium (Ti), Chromium (Cr) and Molybdenum (Mo).

In various embodiments, the fourth electrode 342 may act as a seed layer, for example a metal seed layer, for the deposition of the piezoelectric element 310 (e.g. Aluminum Nitride (AlN)) so that the piezoelectric material of the piezoelectric element 310 may be grown with a better or improved quality.

It should be appreciated that other embodiments may be possible, for example the isolator 316 that extends to and along the plane of the first electrode 302, or the fourth electrode 342.

In various embodiments, the first electrode 302 and the second electrode 304 are capacitive electrodes configured for capacitive transduction, while the second electrode 304 and the third electrode 314 are piezoelectric electrodes configured for piezoelectric tuning. Therefore, the second electrode 304 functions as both a capacitive electrode and a piezoelectric electrode, relative to the first electrode 302 and the third electrode 314 respectively. The piezoelectric element 310 is placed on top of or over the movable capacitive electrode 304.

As shown in FIG. 3B, a first energy source 344 may be provided in electrical communication with the first electrode 302 and the second electrode 304, for example to provide a capacitive voltage such that the transducer 340 may perform capacitive transduction. In addition, a second energy source 346 may be provided in electrical communication with the third electrode 314 and the fourth electrode 342, or that the second energy source 346 may be provided in electrical communication with the third electrode 314 and the second electrode 304, with or without the fourth electrode being provided in the transducer 340. In various embodiments, the fourth electrode 342 has the same electrical potential as that of the second electrode 304.

The second energy source 346, for example, provides a piezoelectric voltage such that the piezoelectric element 310 generates an electro-mechanical coupling effect during piezoelectric tuning. During piezoelectric tuning of the transducer 340, the piezoelectric element 310 may provide a stretching force, as represented by the directional arrows 348, on the second electrode 304, or a compressive force.

The first energy source 344 and the second energy source 346 may provide the same or different electrical potentials to the first electrode 302 and the third electrode 314.

As shown in FIGS. 3A and 3B, at least a portion of the first electrode 302 and at least a portion (e.g. the core portion 306) of the second electrode 304 are separated by a gap 312, for example an air gap or vacuum. In addition, a portion of the peripheral portion 308 of the second electrode 304 may be separated from the first electrode 302 by the gap 312.

As shown in FIGS. 3A and 3B, each of the first electrode 302, the second electrode 304 and the third electrode 314 are positioned in substantially different planes.

Figure 4:
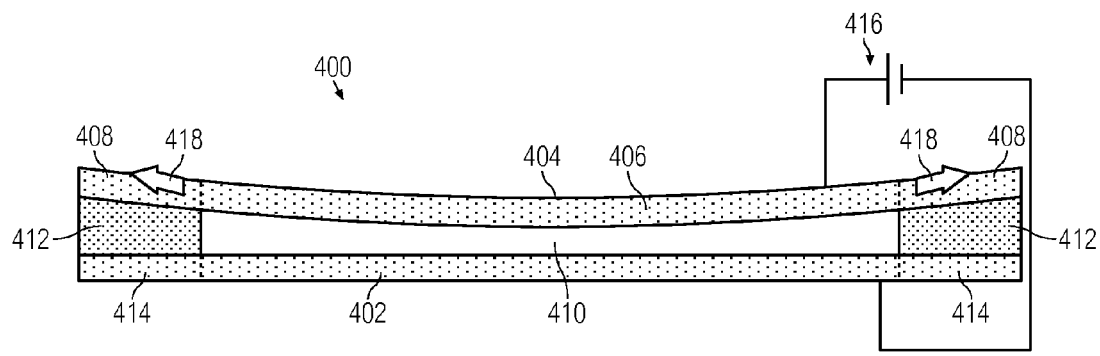
FIG. 4 shows a cross-sectional view of a transducer, according to various embodiments.

FIG. 4 shows a cross-sectional view of a transducer 400, according to various embodiments, during piezoelectric tuning. The transducer 400 may have an overall circular structure. However, it should be appreciated that the transducer 400 may have other structural shapes, for example a square structure or a rectangular structure. The transducer 400 includes a first electrode 402 and a second electrode 404 disposed over the first electrode 402, where the first electrode 402 and the second electrode 404 form respective capacitive electrodes of a capacitor. The first electrode 402 has a cross-sectional dimension substantially similar to the second electrode 404. The first electrode 402 and the second electrode 404 are at least substantially parallel to each other, when no piezoelectric tuning is carried out.

The second electrode 404 has a continuous structure, where a part of it may be defined as a core portion 406 and the remaining part defined as a peripheral portion 408.

As shown in FIG. 4, at least a portion of the first electrode 402 and at least a portion (e.g. the core portion 406) of the second electrode 204 are separated by a gap 410, for example an air gap or vacuum.

The transducer 400 further includes a piezoelectric element 412 disposed between the peripheral portion 408 of the second electrode 404 and a peripheral portion 414 of the first electrode 402. In other words, the piezoelectric element 412 is placed peripherally over the boundary of the first electrode 402 and the second electrode 404, in between the first electrode 402, and the second electrode 404. The piezoelectric element 412 may have a shape or geometrical configuration that is at least substantially same as that of the peripheral portion 408 of the second electrode 404. The piezoelectric element 412 has a thickness equivalent to the gap size or distance between the capacitive parallel electrodes (i.e. the first electrode 402 and the second electrode 404).

The piezoelectric element 412 may provide a tensional force onto the second electrode 404, where the tensional force may be tuned or varied by varying a piezoelectric voltage applied between the first electrode 402 and the second electrode 404.

The tensional force (which may include a tensile strain) is in a direction substantially perpendicular to the direction of the piezoelectric voltage applied between the first electrode 402 and the second electrode 404.

An energy source 416 may be provided in electrical communication with the first electrode 402 and the second electrode 404, for example to provide a voltage, as both capacitive voltage and piezoelectric voltage, which may include a DC bias voltage and an AC driving voltage, such that the transducer 400 may perform capacitive transduction, and also such that the piezoelectric element 412 generates an electro-mechanical coupling effect during piezoelectric tuning. Therefore, capacitive transduction and piezoelectric tuning are carried out using the same electrodes. In other words, the first electrode 402 and the second electrode 404 function as both capacitive electrodes and piezoelectric electrodes and that a same voltage is applied as both the capacitive voltage and the piezoelectric voltage. However, such a configuration may reduce the freedom or flexibility in tuning the stiffness and the active damping.

During piezoelectric tuning of the transducer 400, the piezoelectric element 412 may provide a stretching force, as represented by the directional arrows 418, on the second electrode 404, or a compressive force.

Compared to the configuration of the transducers 300 (FIG. 3A), 340 (FIG. 3B), the fabrication of the transducer 200 (FIGS. 2A and 2B) requires a reduced number of fabrication mask layers, while maintaining at least substantially similar general transducer performance and piezoelectric coupling effects. The fabrication of the transducer 400 (FIG. 4) requires a further reduced number of mask layers.

Figure 5A:
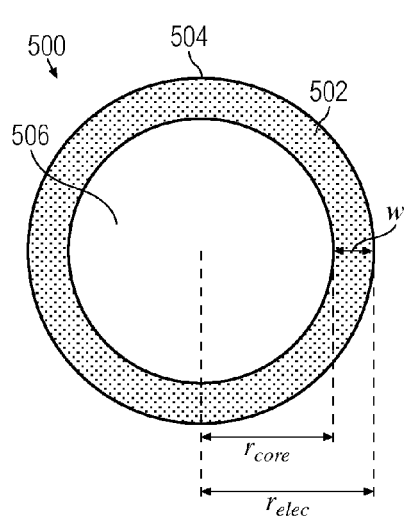
FIGS. 5A and 5B show plan views of a piezoelectric element disposed over a peripheral portion of an electrode of a transducer, according to various embodiments.
Figure 5B:
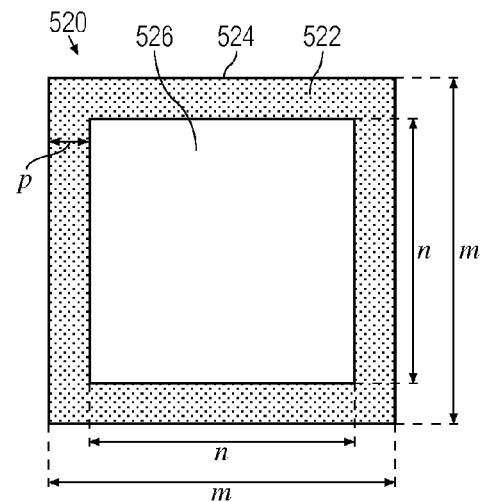

FIG. 5A shows a plan view of a transducer 500 of a circular configuration while FIG. 5B shows a plan view of a transducer 520 of a square configuration, according to various embodiments.

FIG. 5A shows a plan view of a piezoelectric element or layer 502 disposed over a peripheral portion of an electrode (e.g. a second electrode) 504 of the transducer 500 of a circular configuration, according to various embodiments. The electrode 504 may have a radius, $r_{elec}$, in a range of between about 100 μm and about 1 mm (1000 μm), for example a range of between about 200 μm and about 800 μm or a range of between about 400 μm and 600 μm, depending on the applications, while the core portion 506 of the electrode 504 may have a radius, $r_{core}$ of approximately three-quarter of $r_{elec}$ (i.e. $0.75 \cdot r_{elec}$). Therefore, the piezoelectric element 502 may have a width, w, of approximately $0.25 \cdot r_{elec}$.

FIG. 5B shows a plan view of a piezoelectric element or layer 522 disposed over a peripheral portion of an electrode (e.g. a second electrode) 524 of the transducer 520 of a square configuration, according to various embodiments. The electrode 524 may have a width and length, m, in a range of between about 100 μm and about 1 mm (1000 μm), for example a range of between about 200 μm and about 800 μm or a range of between about 400 μm and 600 μm, depending on the applications, while the core portion 526 of the electrode 524 may have a width and length, n, of approximately three-quarter of m (i.e. $0.75 \cdot m$). Therefore, the piezoelectric element 522 may have a width, p, of approximately $0.25 \cdot m$.

However, it should be appreciated that the transducers of various embodiments may have other suitable shapes, for example an ellipse, an oval or a rectangle, and/or dimensions.

In the context of the embodiments of FIGS. 2A, 2B, 3A, 3B and 4, the second electrode 204, 304, 404, may include or may be a capacitive membrane or a vibrating membrane, which may be movable or stretchable or flexible, with the piezoelectric element or layer 212, 310, 412, disposed over the peripheral portion 208, 308, 408 of the second electrode 204, 304, 404, such that a majority of the surface area of the second electrode 204, 304, 404, (e.g. the capacitive membrane) is exposed (as also illustrated in FIGS. 5A and 5B). By bonding or tightly bonding the piezoelectric element 212, 310, 412, to the peripheral portion 208, 308, 408 of the capacitive membrane 204, 304, 404, there may be minimal interference on the dynamic behaviors of the capacitive membrane 204, 304, 404, and which may allow the use of a thin and compliant membrane for sensitivity improvement and mechanical impedance matching.

In the context of various embodiments, the structure of the transducer 200, 300, 340, 400 may be sealed so as to form a vacuum chamber between the first electrode 202, 302, 402 and the second electrode 204, 304, 404.

When the capacitive voltage is applied between the capacitive electrodes, e.g. between the first electrode 202, 302, 402 and the second electrode 204, 304, 404, the transducer 200, 300, 340, 400 performs capacitive transduction, which may be either actuation or sensing. As the piezoelectric electrodes are charged, e.g. between the second electrode 204, 304, and the third electrode 210, 314 of FIGS. 2A, 2B, 3A and 3B or between the first electrode 402 and the second electrode 404 of FIG. 4, the piezoelectric element 212, 310, 412, begins to generate an electro-mechanical coupling effect.

In various embodiments, the poling direction of the piezoelectric element 212, 310, 412, is at least substantially aligned normal to the plane of the capacitive membrane 204, 304, 404, thereby enabling the use of the "$d_{31}$" mode of the piezoelectric actuation. For the "$d_{31}$" mode, the first subscript "3" represents the direction of the electric field being parallel with the poling direction and the second subscript "1" represents the corresponding generated mechanical stress along the horizontal direction, which means that the piezoelectric element may generate a lateral strain on the second electrode (or capacitive membrane) 204, 304, 404, when a piezoelectric voltage is applied transversely between the piezoelectric electrodes.

When the direction of the piezoelectric voltage is at least substantially aligned with the poling direction of the piezoelectric element 212, 310, 412, the mechanical strain generated by the piezoelectric element 212, 310, 412, on the second electrode (or capacitive membrane) 204, 304, 404, is tensile strain. Therefore, the piezoelectric element 212, 310, 412, may provide additional stretching force on the vibrating membrane 204, 304, 404, through the "$d_{31}$" coupling mode, where the strength of the stretching force may be controlled by adjusting the piezoelectric voltage.

When the direction of the piezoelectric voltage is at least substantially oppositely aligned with the poling direction of the piezoelectric element 212, 310, 412, the mechanical strain generated by the piezoelectric element 212, 310, 412, on the second electrode (or capacitive membrane) 204, 304, 404, is compressive strain.

Therefore, depending on the direction of the piezoelectric voltage, the piezoelectric element 212, 310, 412, causes either the capacitive membrane 204, 304, 404, to shrink or compress due to a compressive force or to elongate or stretch due to a stretching force.

Without considering the external pressure on the capacitive membrane 204, 304, 404, the piezoelectric stretching force, together with the structural restoring stiffness force, may compete with the attractive electrostatic force between the capacitive electrodes, thereby minimising or preventing the "collapse mode" of the capacitive transduction.

The dynamic governing equation of the capacitive membrane and the derivation thereof will now be described as below.

The vibration of a moveable plate may be determined by the following plate governing equation.

$$D\nabla^4 w + \rho h \ddot{w} = P \quad \text{(Equation 1)}$$

where w=w (x, y) is the transverse displacement of the plate with x representing the x-axis and y representing the y-axis;

$$\ddot{w} = \frac{d^2 w}{dt^2};$$

$$\nabla^4 w = \frac{\partial^4 w}{\partial x^4} + 2\frac{\partial^4 w}{\partial x^2 \partial y^2} + \frac{\partial^4 w}{\partial y^4};$$

$$D = \frac{Eh^3}{12(1-\mu^2)}$$

is the elastic constant;

E is the Young's modulus of the plate, which is an intrinsic property of the material and may vary depending on the material used for the plate for different designs and/or applications;

h is the thickness of the plate;

μ is Poisson's ratio, which is an intrinsic property of the material and may vary depending on the material used for the plate for different designs and/or applications;

ρ is the plate material's density, which is an intrinsic property of the material and may vary depending on the material used for the plate for different designs and/or applications; and P is the external pressure.

When applying a capacitive voltage, an electrostatic pressure is generated as $$P_e = -\frac{1}{2}\frac{d\Delta c}{dw}V^2 \bigg|_{g_0+w_0} \quad \text{(Equation 2)}$$

where Δc is the capacitance variation due to electrode plate movement;

V is the capacitive voltage applied;

w=$w_0$+w', where the transverse displacement, w, is represented as equilibrium position $w_0$ and dynamic response w'; and the gap size between the two electrode plates, g=$g_0$+$w_0$+w'.

When only considering the fundamental vibration mode of the plate, its transverse displacement may be represented as $$w(x,y,t) = \phi(x,y)\eta(t) \quad \text{(Equation 3)}$$

where $$\phi = \left[\left\{\cosh\left(\frac{\varepsilon x}{a}\right) - \cos\left(\frac{\varepsilon x}{a}\right) - \alpha\sinh\left(\frac{\varepsilon x}{a}\right) - \sin\left(\frac{\varepsilon x}{a}\right)\right\}\left\{\cosh\left(\frac{\varepsilon y}{a}\right) - \cos\left(\frac{\varepsilon y}{a}\right) - \alpha\sinh\left(\frac{\varepsilon y}{a}\right) - \sin\left(\frac{\varepsilon y}{a}\right)\right\}\right]$$

is the mode shape for square plate with fixed boundaries;

η is the modal coordinates;

t is time;

a is the length of the edge of the square plate; and

{∈=4.730040856, α=0.98250222} are the coefficients.

When expanding Equation 2 around the equilibrium position $(g_0+w_0)$ through Taylor expansion, Equation 1 becomes two equations, being the equation to determine the plates' equilibrium position (Equation 4) and the dynamic equation around its equilibrium position (Equation 5).

$$D\nabla^4 \phi \eta_0 = -\frac{1}{2}\frac{\varepsilon}{(g_0+w_0)^2}V_0^2 \quad \text{(Equation 4)}$$

$$D\nabla^4 \phi \eta + \rho h \ddot{\eta} - \frac{\varepsilon}{(g_0+w_0)^3}V_0^2 \phi \eta = -\frac{\varepsilon}{(g_0+w_0)^2}V_0 V_1 e^{i\omega t} \quad \text{(Equation 5)}$$

where $$\left(-\frac{\varepsilon}{(g_0+w_0)^3}V_0^2\right)$$

is the negative electrostatic stiffness coefficient;

$$\ddot{\eta} = \frac{d^2\eta}{dt^2};$$

$\eta_0$ represents the initial state of the system; and
the electrostatic voltage or capacitive voltage, V, being decomposed to a DC bias voltage, $V_0$, and an AC component $V_1$.

By introducing the piezoelectric tuning to the original governing equation, Equation 1 becomes, $$D\nabla^4 w + \rho h \ddot{w} = P + P_e + \left(N_x \frac{\partial^2 w}{\partial x^2} + N_y \frac{\partial^2 w}{\partial y^2}\right) \quad \text{(Equation 6)}$$

Without considering the external pressure, P, on the electrode membrane, and where the electrostatic pressure, $P_e$, in the case of parallel plates transducers is $$\left(-\frac{\varepsilon V^2}{2(g_0+w)^2}\right),$$

Equation 6 may be represented as Equation 7 as the dynamic governing equation of a moveable plate or a capacitive membrane.

$$D\nabla^4 w + \rho h \ddot{w} = N_x \frac{\partial^2 w}{\partial x^2} + N_y \frac{\partial^2 w}{\partial y^2} - \frac{\varepsilon V^2}{2(g_0+w)^2} \quad \text{(Equation 7)}$$

where w=w (x, y) is the vertical displacement of the capacitive membrane with x representing the x-axis and y representing the y-axis;

$$D = \frac{Eh^3}{12(1-\mu^2)}$$

is the elastic constant;
E is the Young's modulus of the membrane, which may vary depending on the material used for different designs and/or applications;

h is the thickness of the membrane;
μ is Poisson's ratio, which may vary depending on the material used for different designs and/or applications;
ρ is the membrane's density, which may vary depending on the material used for different designs and/or applications;

$$N_x = \frac{Ed_{31}V_p}{(1-\mu)t_p}ah$$

is the stretching force per unit length along a longitudinal direction due to the piezoelectric actuation;

$$N_y = \frac{Ed_{31}V_p}{(1-\mu)t_p}ah,$$

which is similar to $N_x$ due to a symmetric structure;
a is the length of the edge of the membrane;
$d_{31}$ is the piezoelectric coupling coefficient;
$V_p$ is the voltage applied to the piezoelectric electrodes, i.e. the piezoelectric voltage;
$t_p$ is the thickness of the piezoelectric element;

$$\left(-\frac{\varepsilon V^2}{2(g_0+w)^2}\right)$$

is the electrostatic pressure, $P_e$, in the case of parallel plates transducers;
V is the potential difference between the capacitive electrodes, i.e. capacitive voltage;
$g_0$ is the nominal gap size between the capacitive electrodes; and
∈=4.7300408 is a coefficient.

Equation 7 may be linearized around the equilibrium state at $w=w_0$ and $V=V_0$ to obtain the following equation.

$$D\nabla^4 w + \rho h \ddot{w} - \frac{\varepsilon V_0^2}{(g_0+w_0)^3}w - N_x\left(\frac{\partial^2 w}{\partial x^2}\right) - N_y\left(\frac{\partial^2 w}{\partial y^2}\right) = \quad \text{(Equation 8)}$$
$$-\frac{\varepsilon V_0^2}{2(g_0+w_0)^2} - \frac{\varepsilon V_0 V_1}{(g_0+w_0)^2}$$

where $$\left(-\frac{\varepsilon V_0^2}{(g_0+w_0)^3}\right)$$

is the negative electrostatic stiffness coefficient; and
the electrostatic voltage or capacitive voltage, V, being decomposed to a DC bias voltage, $V_0$, and an AC component $V_1$.

The right-hand-side of Equation 8 represents the linearized electrostatic actuation while the left-hand-side shows that the electrostatic pressure may "soften" the plate structure and reduce the system equivalent stiffness, whereas the piezoelectric stretching force may tune the equivalent stiffness in either positive or negative directions. When the stretching force, $N_x$, is tensional, the stretching force increases the equivalent stiffness. Therefore, by adjusting the value of the piezoelectric voltage, $V_p$, and the DC bias, $V_0$, of the electrostatic voltage V, the system equivalent stiffness may be tuned in a relatively wide range. Therefore, there are various possibilities or designs with regard to the tuning of the piezoelectric stiffness for sensing and actuation, where the incorporation of piezoelectric tuning provides an approach for balancing the electrostatic collapse and enables flexibility in the design of capacitive transducers.

For example, in cases of designing capacitive sensors such as microphones or ultrasound receivers, the capacitive membrane should be thin and compliant so as to obtain a relatively high mechanical-acoustical coupling coefficient. However, the compliant membrane structure may have a relatively low resonant frequency, which may require the piezoelectric element or layer to provide electrical stiffness to tune the resonant frequency to the desired value. When manufacturing the traditional condenser microphone, the microphone membrane is stretched like a "drumhead" and the tensional force is adjusted to tune the microphone's resonant frequency. However, this may not be practical for the micro-machined capacitive sensors due to the small dimension and the costs of man-power. Therefore, piezoelectric stiffness tuning provides an approach for developing small-sized, high-sensitivity micro-machined capacitive sensors.

When designing capacitive actuators such as ultrasound transmitters or micro-machined micro-speakers, the requirements to be considered are the strength and efficiency of the power output. In order to match the energy density of the magnetic or piezoelectric actuators, the capacitive actuators may have to maintain a small gap size, which may reduce the collapse voltage. On the other hand, the actuators' membranes should be thin for mechanical impedance matching with the medium, which may reduce the structure stiffness, and may further diminish the collapse voltage. By providing piezoelectric stiffness tuning, including static stiffness tuning and dynamic stiffness tuning, the capacitive actuators may maintain a thin membrane and may relatively increase the gap size while increasing the collapse voltage.

Numerical simulations and analysis of the transducers of various embodiments are now described with reference to the following non-limiting examples.

For a transducer design, there is a trade-off between the bandwidth and the mechanical sensitivity. As an example, in the case of designing parallel-plate capacitive transducers, having a thinner plate provides for higher mechanical sensitivity. However, as the plate gets thinner, the structural stiffness decreases and consequently reduces the bandwidth of the transducer.

Using a microphone design as an example of the transducer, mechanical sensitivity, $S_{mech}$, may be defined as follows $$S_{mech} = \frac{w_{1/2}}{P} = \frac{\phi_{1/2}\eta}{P} = \frac{\phi_{1/2}a^2 \int\int \phi dxdy}{k_m} \propto \frac{1}{k_m} \quad \text{(Equation 9)}$$

where w is the vertical displacement of the capacitive membrane or plate;
$w_{1/2}$ is the response or displacement at the middle of the capacitive plate;
$\phi$ is the mode shape for a square capacitive plate with fixed boundaries;
$\eta$ is the modal coordinates;
a is the length of the edge of the square capacitive plate;

$$k_m = \frac{Eh^3}{12(1-\mu^2)} \int\int \nabla^4 \phi\phi dxdy;$$

$\left(\frac{Eh^3}{12(1-\mu^2)}\right)$ is the elastic constant, D;
E is the Young's modulus of the capacitive plate;
h is the thickness of the capacitive plate;
$\mu$ is Poisson's ratio; and
P is the external pressure.

Figure 6:
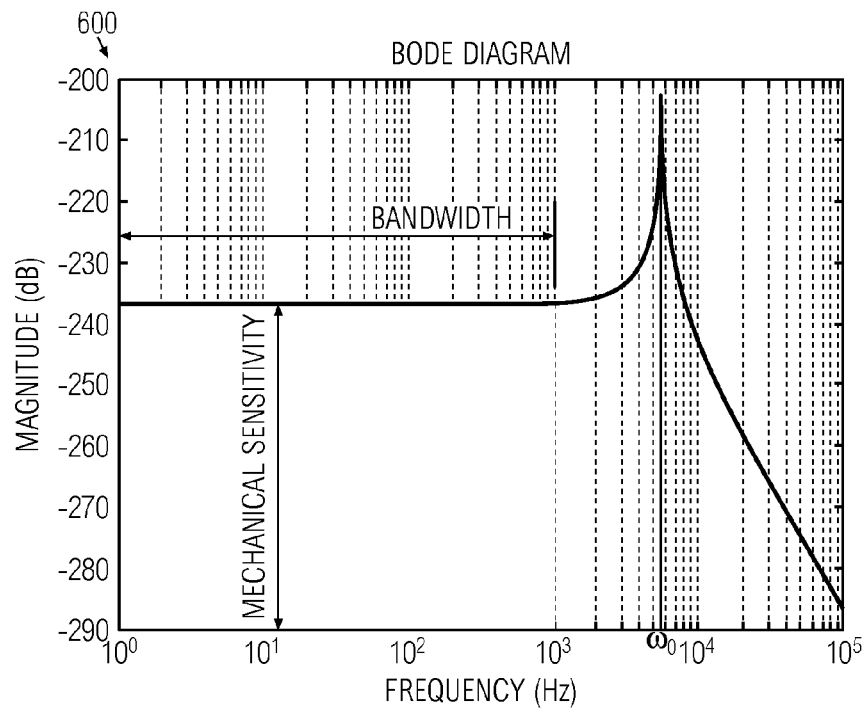
FIG. 6 shows a plot illustrating the relationship between the bandwidth and the mechanical sensitivity of a transducer.

FIG. 6 shows a plot 600 illustrating the relationship between the bandwidth and the mechanical sensitivity of a transducer.

Figure 7:
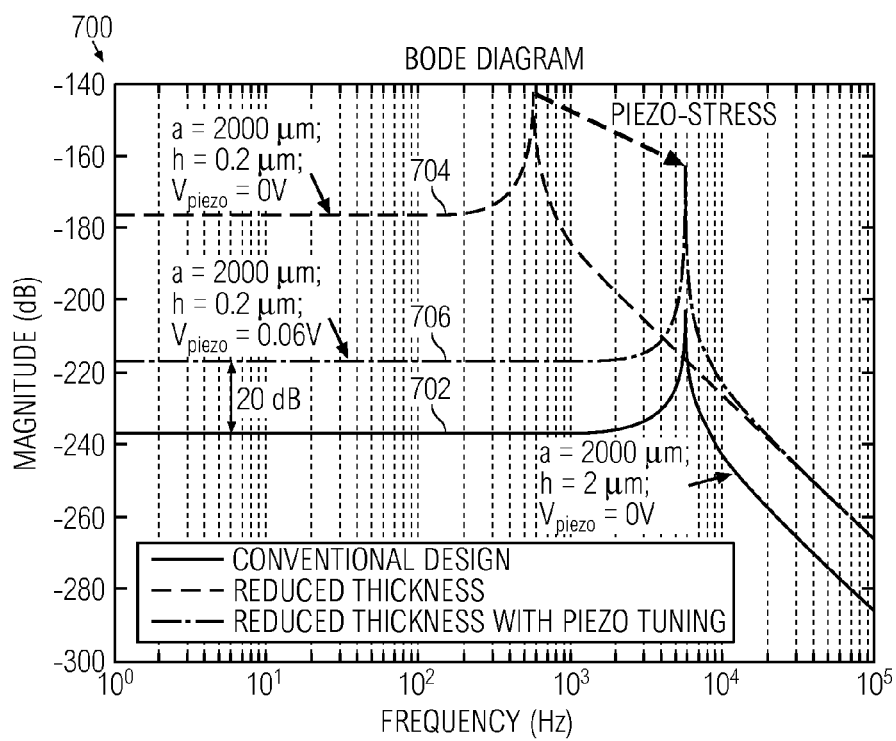
FIG. 7 shows a plot illustrating a comparison of the frequency response of a conventional capacitive microphone, a conventional capacitive microphone with a thinner plate and a microphone with piezoelectric tuning of various embodiments.

FIG. 7 shows a plot 700 illustrating a comparison of the frequency response (or bandwidth-sensitivity) of a conventional capacitive microphone 702, a conventional capacitive microphone with a thinner plate 704 and a microphone with piezoelectric tuning 706 of various embodiments.

The result 702 is for a conventional microphone with its diaphragm or membrane having an edge length, a, of about 2000 μm and a thickness, h, of about 2 μm, and its resonant frequency set at about 6000 Hz, as determined by the structure.

By reducing the thickness to approximately 0.2 μm in order to increase the mechanical sensitivity, its resonant frequency decreases to about 550 Hz, as shown in the result 704, which may be too low for microphone applications.

However, by incorporating piezoelectric tuning to the same design with a thinner plate and applying a piezoelectric voltage of approximately 0.06 V, a resonant frequency of about 6000 Hz may be achieved as shown in the result 706, similar to that of the conventional microphone, while also achieving a higher sensitivity of about 20 dB compared to the conventional microphone. Therefore, implementing piezoelectric tuning may overcome the design trade-off between the bandwidth and the mechanical sensitivity such that the transducers of various embodiments may be able to overcome this trade-off by maintaining at least substantially similar bandwidth while increasing the mechanical sensitivity, despite a thinner capacitive membrane.

Figure 8:
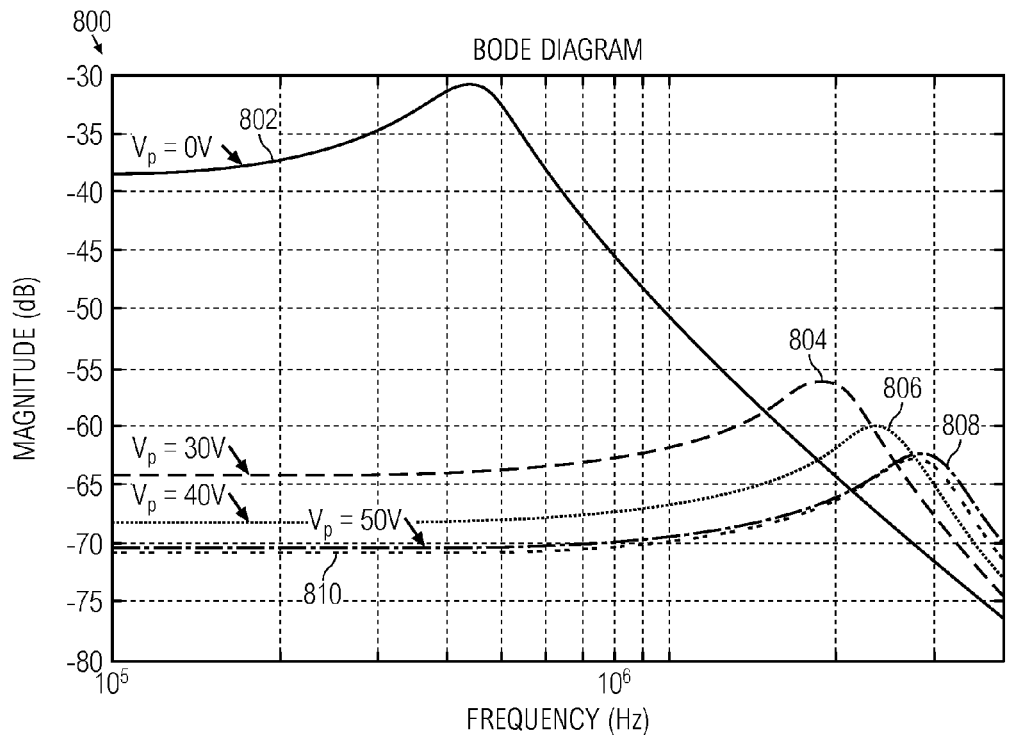
FIG. 8 shows a plot illustrating a frequency response of a transducer with piezoelectric tuning, according to various embodiments.

FIG. 8 shows a plot 800 illustrating the frequency response of a transducer with piezoelectric tuning, according to various embodiments. The plot 800 shows the results for an ultrasound transducer having a square shape membrane of structural parameters of length of edge, a, of about 100 μm, thickness, h, of about 0.4 μm, and nominal gap size, $g_0$, of about 0.3 μm, with an applied capacitive DC voltage, $V_0$, of about 20 V and piezoelectric tuning voltages, $V_p$, of between about 0 V to about 50 V, for different piezoelectric stiffness tuning. The result 802 is obtained for $V_p$=0 V, the result 804 is obtained for $V_p$=30 V, the result 806 is obtained for $V_p$=40 V, and the result 808 is obtained for $V_p$=50 V. The result 810 is shown as a reference design, for example with a desired bandwidth, to illustrate the tuning of the piezoelectric voltages, $V_p$, for the transducers of various embodiments, so as to at least substantially match the bandwidth of the reference design.

In various embodiments, the piezoelectric stiffness tuning may adjust the overall equivalent stiffness of the capacitive transducers through statically changing of the piezoelectric voltage, $V_p$, while piezoelectric active damping tuning may provide active damping to the transducer or transducer system through a feedback control scheme. By statically changing of $V_p$, it is meant as setting up $V_p$ in advance and that during operation or in operational mode, $V_p$ is a constant or remains substantially constant.

Figure 9:
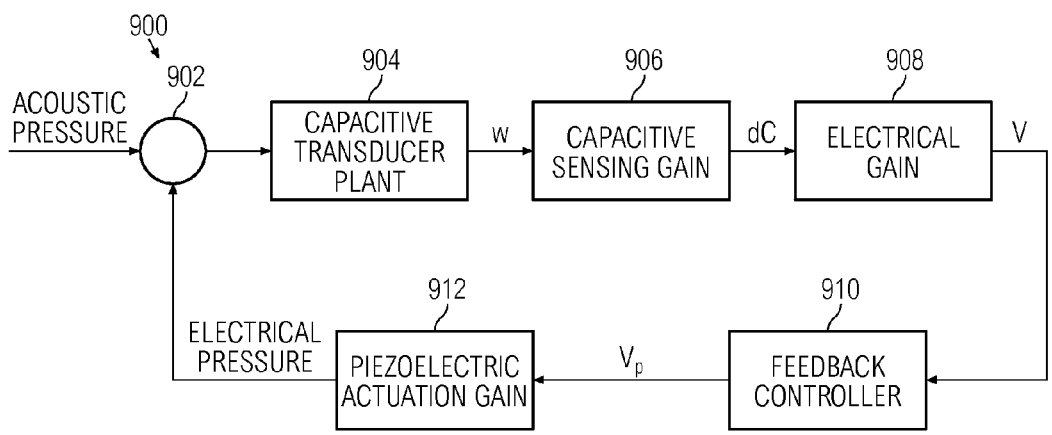
FIG. 9 shows a schematic block diagram of a feedback control scheme for active damping tuning, according to various embodiments.

In various embodiments, rather than providing a static DC piezoelectric voltage to the piezoelectric electrodes, an electrical control system employing a feedback control scheme 900 as shown in FIG. 9 may be formed or provided by feeding capacitive sensing output to a controller of the control system and driving the piezoelectric electrodes through the controller output to dynamically adjust the stretching force on the electrode membrane. The controller may provide control for active damping and/or stiffness tuning.

The feedback control scheme 900 includes a summation operator 902 with acoustic pressure and electrical pressure as the inputs, a capacitive transducer plant block 904, a capacitive sensing gain block 906, an electrical gain block 908, a feedback controller block 910 and a piezoelectric actuation gain block 912.

The capacitive transducer plant block 904 provides a transfer function of the mechanical transducer itself and the capacitive sensing gain block 906 transfers the transducer's output, for example displacement of the membrane, into capacitance variations. Then, the electrical gain block 908 amplifies the capacitance variations to produce an output voltage. The output voltage is then provided to the feedback controller block 910 where the output driven voltage for the piezoelectric element is determined by active damping control law. The piezoelectric actuation gain block 912 represents an equivalent transfer function that converts the electrical actuation voltage into an electrical pressure or an equivalent mechanical pressure.

As capacitive sensing provides limited state information, for example the state of displacement, the control system for the transducer may implement the output feedback control scheme 900 with the sensing output, V, being feedbacked into the controller 910. Then, the active damping controller 910 drives the piezoelectric element with voltage $V_p$. Compared to the stiffness tuning scheme where $V_p$ is a static DC value, the active damping tuning scheme adjusts the piezoelectric stretching force dynamically through the controller output $V_P$, which includes DC and/or AC value.

In various embodiments, the active damping tuning scheme may reduce the transducer's noise (e.g. thermal noise), for example a condenser microphones' noise floor, which is related to the microphone's passive damping. Therefore, transducers, such as condenser microphones, may be designed in such a way that its passive acoustical damping, dependent on the acoustical holes, is kept low while utilizing electrical active damping through piezoelectric tuning to compensate for the transducers' dynamic performance, thereby providing transducers with a large effective damping.

Figure 10:
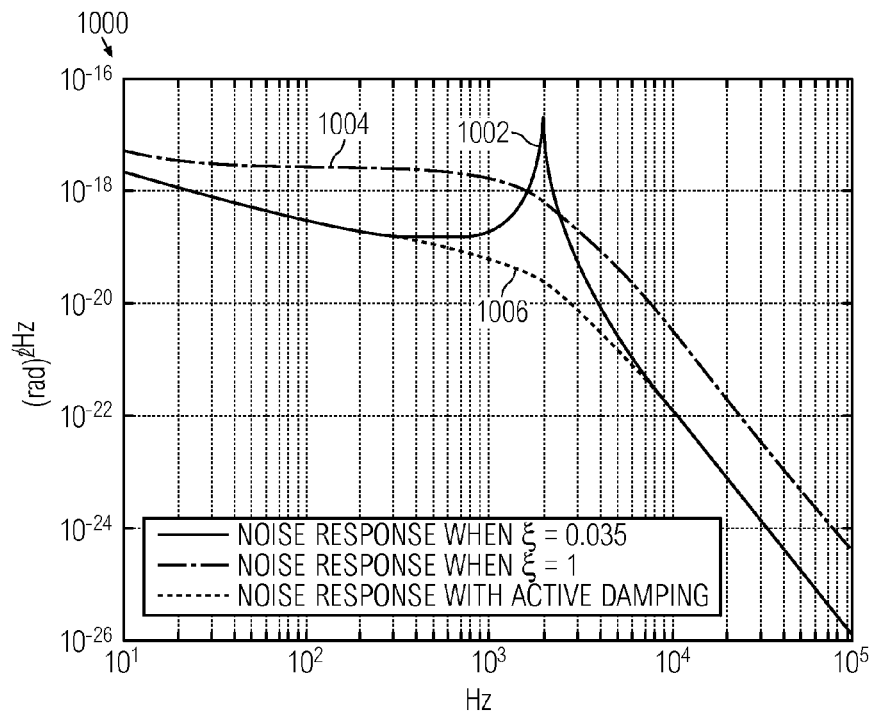
FIG. 10 shows a plot of noise performance of different microphone damping schemes.

FIG. 10 shows a plot 1000 of noise performance, in the form of power spectral density, of different microphone damping schemes, to illustrate the effectiveness of the active damping scheme via piezoelectric tuning. The plot 1000 shows results for a noise response 1002 with a damping ratio, $\xi=0.035$, a noise response 1004 with a damping ratio, $\xi=1$ and a noise response 1006 with active damping.

The noise response 1006 shows that active damping provides a substantially similar damping response and a lower noise compared to the noise response 1004 with $\xi=1$.

In various embodiments, in addition to providing active damping to the transducer system, the feedback control scheme may adaptively adjust the transducer's resonant frequency and sensitivity through piezoelectric stiffness tuning control. This may improve the performance of the transducer, in particularly a transducer array which requires consistency of each individual cell or element.

In various embodiments, transducer designs may require an array configuration for performance improvement, where the individual transducer element of the array is required to have uniform sensitivity for an improved array performance. However, even for transducers fabricated through MEMS processing, it is difficult to maintain uniform sensitivity of individual transducers due to, for example variations or process fluctuations during fabrication and manufacture which may cause a variation in the thickness of the individual elements, which therefore requires steps or methods to provide sensitivity matching. However, by incorporating piezoelectric tuning, various embodiments of the transducers may provide improved sensitivity uniformity for an array of transducer elements, thereby itself providing sensitivity matching.

Figure 11:
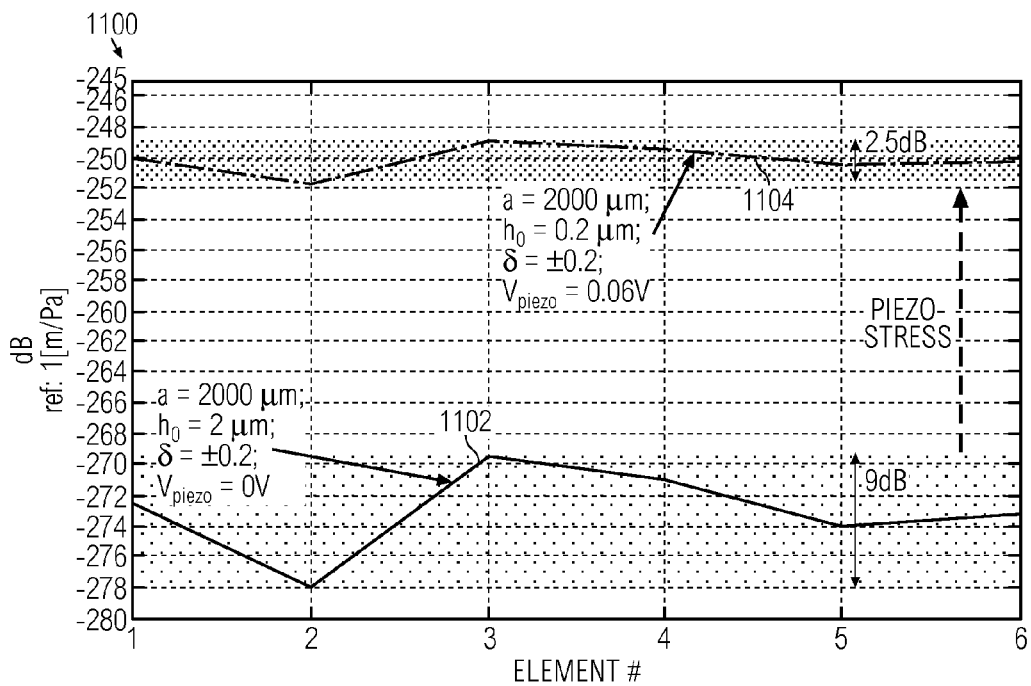
FIG. 11 shows a plot illustrating a comparison of the sensitivity matching between a conventional capacitive microphone and a microphone with piezoelectric tuning of various embodiments.

FIG. 11 shows a plot 1100 illustrating a comparison of the sensitivity matching between a conventional array of capacitive microphones 1102 and an array of microphones with piezoelectric tuning 1104 of various embodiments, each array having six individual transducer elements, respectively based on a similar design or configuration as that in the context of FIG. 7. The individual elements of the array may be arranged in a grid pattern of, for example 3 columns×2 rows. The y-axis of plot 1100 represents the dB values or scale where the term "ref: 1 [m/Pa]" refers to a reference value for the dB scale, or where dB=20*$\log_{10}$(y_value/1). The term y_value refers to the mechanical sensitivity value obtained in unit [m/Pa].

The nominal parameters for each of the element for the conventional capacitive microphone may be set at an edge length, a, of about 2000 μm and a thickness, $h_0$, of about 2 μm, while the nominal parameters for each of the element for the microphone with piezoelectric tuning of various embodiments may be set at an edge length, a, of about 2000 μm and a thickness, $h_0$, of about 0.2 μm.

The actual thickness, h, of the individual elements may be defined as $h=h_0(1+\delta)$, where $h_0$ is the nominal thickness and δ is the thickness variation.

With a thickness variation δ=±0.2, the result 1102 of the conventional capacitive microphones show a sensitivity variation of about 9 dB, while the result 1104 of the microphones of various embodiments with piezoelectric tuning show a sensitivity variation of less than about 3 dB, such that the sensitivity variation is reduced from about 9 dB to about 2.5 dB with piezoelectric tuning, coupled with a thinner transducer element.

Capacitive micromachined ultrasound transducers (cMUTs) may provide array fabrication, front-end circuit integration and relative low acoustic impedance. However, cMUTs suffer from low acoustic power output, which is limited by the collapse voltage. However, the incorporation of piezoelectric tuning mechanism may help to increase the radiation pressure of the cMUTs.

The radiation pressure from a baffled plate may be determined by Rayleigh Integration as follows $$P_{rad} = -\frac{\omega^2 \rho}{2\pi}\eta \int \int \frac{e^{-ik|r-r'|}}{|r-r'|}\phi dx' dy' \qquad \text{(Equation 10)}$$

where r'=r' (x', y') is the coordinates on the transducer plate;

r=r (x, y) is the coordinates of the observing points;

$$\eta = -\frac{\iint \frac{\varepsilon V_o V_1}{2(g_o+g)^2} \phi dx dy}{D \iint \nabla^4 \phi \phi dx dy}$$

is the modal response;

ω is the angular frequency, where (ω/2π) is the frequency, f;

ρ is the plate's density; and

φ is the mode shape for a square capacitive plate with fixed boundaries.

Increasing the driving voltage, V, increases the radiation pressure output. However, as the driving voltage, V, of conventional cMUTs is limited by the collapse voltage, the increase in radiation pressure is limited and may not be increased as required in various applications.

In contrast, for cMUTs of various embodiments with piezoelectric tuning, the driving voltage, V, having a decomposed DC bias voltage, $V_0$, and an AC component $V_1$ may be increased beyond the conventional collapse voltage limitation, thereby resulting in a much higher radiation pressure.

Figure 12A:
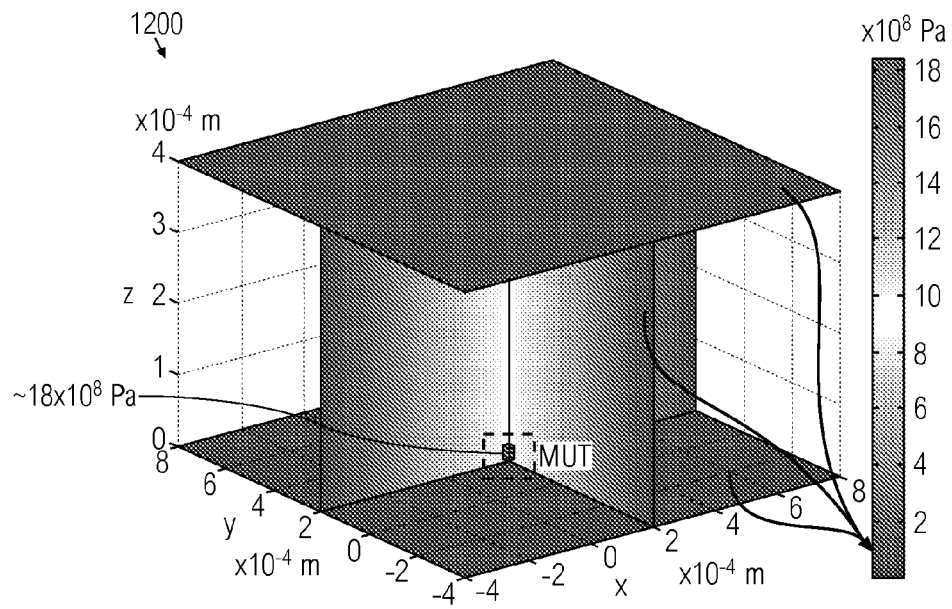
FIG. 12A shows a radiation pressure distribution of a capacitive micromachined ultrasound transducer (cMUT) with piezoelectric tuning at about 8 MHz, according to various embodiments.

FIG. 12A shows a radiation pressure distribution 1200 of a capacitive micromachined ultrasound transducer (cMUT) with piezoelectric tuning at about 8 MHz, according to various embodiments. The axes represent the (x, y, z) geometrical coordinates in unit (m).

Figure 12B:
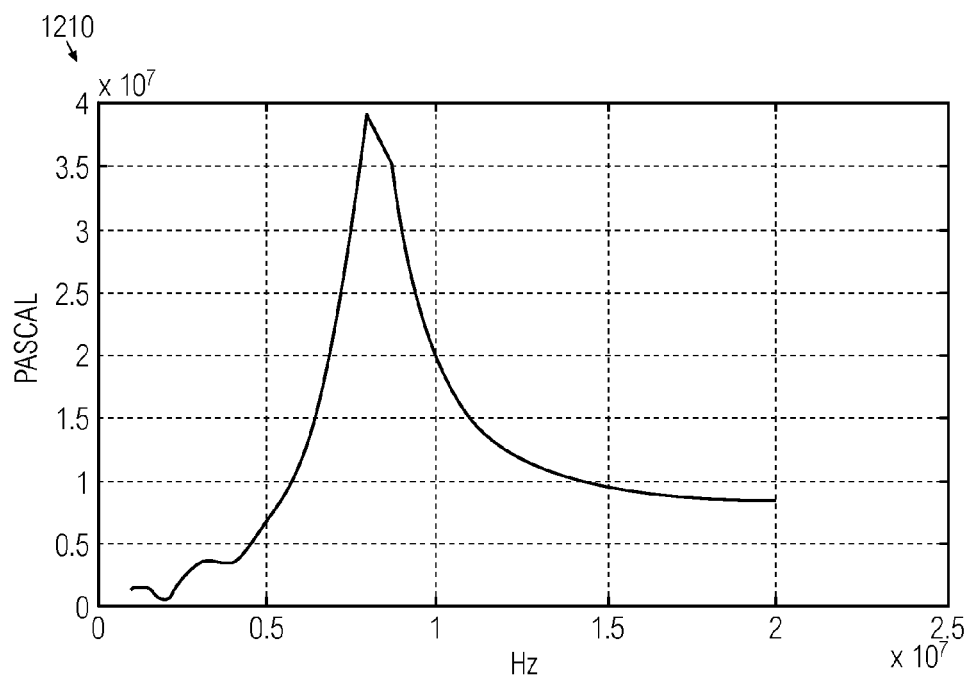
FIG. 12B shows a plot illustrating an average pressure output at the surface of a capacitive micromachined ultrasound transducer (cMUT) with piezoelectric tuning at a driving voltage of about 100 V, according to various embodiments.

FIG. 12B shows a plot 1210 illustrating an average pressure output at the surface of a capacitive micromachined ultrasound transducer (cMUT) with piezoelectric tuning at a driving voltage of about 100 V, according to various embodiments. As shown in FIG. 12B, a radiation pressure output of about 40 MPa may be obtained at about 8 MHz.

Figure 13:
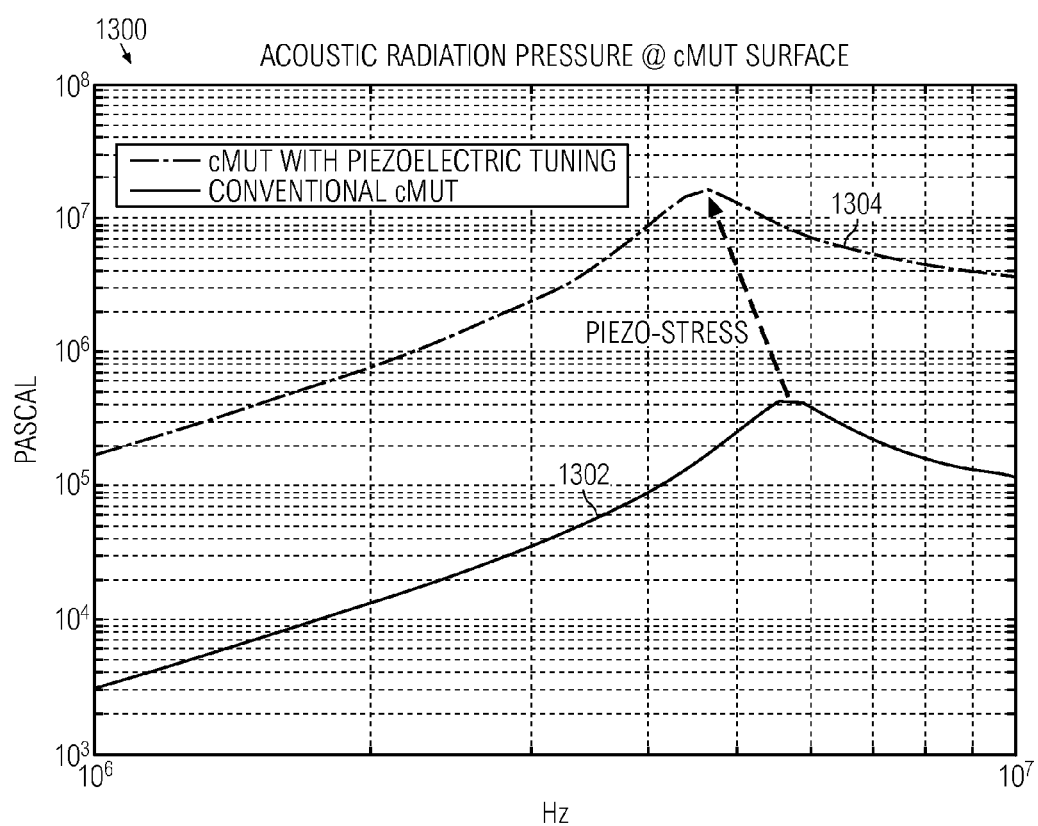
FIG. 13 shows a plot illustrating a comparison of the acoustic radiation pressure at the surface of a conventional capacitive micromachined ultrasound transducer (cMUT) and a cMUT with piezoelectric tuning of various embodiments.

FIG. 13 shows a plot 1300 illustrating a comparison of the acoustic radiation pressure at the surface of a conventional capacitive micromachined ultrasound transducer (cMUT) 1302 and a cMUT with piezoelectric tuning 1304 of various embodiments.

The plot 1300 shows the results for both the conventional cMUT 1302 and the cMUT with piezoelectric tuning 1304, having a square shape membrane of structural parameters of length of edge, a, of about 100 μm, thickness, h, of about 4 μm, and nominal gap size, $g_0$, of about 0.3 μm, with an applied capacitive DC voltage, $V_0$, of about 5 V and a capacitive AC voltage, $V_1$, of about 15 V for the conventional cMUT 1302, and with an applied capacitive DC voltage, $V_0$, of about 20 V, a capacitive AC voltage, $V_1$, of about 100 V and a piezoelectric voltage, $V_p$, of about 0.1 V for the cMUT with piezoelectric tuning 1304.

The result 1302 for the conventional cMUT shows a peak acoustic radiation pressure of about 0.43 MPa with a collapse voltage of about 29 V (as determined separately), while the result 1304 for the cMUT with piezoelectric tuning shows a peak acoustic radiation pressure of about 16 MPa with no collapse voltage.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

We claim:

1. A transducer, comprising:
a first electrode;
a second electrode disposed over the first electrode such that the first electrode and the second electrode form respective capacitive electrodes of a capacitor, the second electrode comprising a core portion and a peripheral portion;
a third electrode disposed relative to the second electrode such that the third electrode overlaps with the peripheral portion of the second electrode; and
a piezoelectric element disposed between the peripheral portion of the second electrode and the third electrode, so as to tune a tensional force provided by the piezoelectric element onto the second electrode by varying a piezoelectric voltage applied between the second electrode and the third electrode,
wherein the first electrode is positioned substantially along the same plane as the third electrode.

2. The transducer of claim 1, wherein the tensional force provided by the piezoelectric element onto the second electrode is in a direction substantially perpendicular to the direction of the piezoelectric voltage applied between the second electrode and the third electrode.

3. The transducer of claim 1, wherein the tensional force comprises a tensile strain.

4. The transducer of claim 1, wherein the first electrode and the second electrode are configured to be substantially parallel to each other.

5. The transducer of claim 1, wherein the second electrode is disposed over the first electrode such that at least a portion of the first electrode and at least a portion of the second electrode are separated by an air gap or vacuum.

6. The transducer of claim 1, further comprising an isolator disposed between the first electrode and the third electrode.

7. The transducer of claim 1, wherein the second electrode comprises a vibrating membrane.

8. The transducer of claim 7, wherein the piezoelectric element is disposed between the peripheral portion of the second electrode and the third electrode so as to minimize interference to movement of the second electrode.

9. The transducer of claim 1, wherein the transducer is configured to perform a capacitive transduction when a capacitive voltage is applied between the first electrode and the second electrode.

10. The transducer of claim 1, wherein the piezoelectric element comprises a material selected from a group consisting of Aluminum Nitride (AlN), Lead Zironate Titanate (PZT), Polyvinylidene Fluoride (PVDF), and Zinc Oxide (ZnO).

11. The transducer of claim 1, wherein each of the first electrode, the second electrode and the third electrode comprises a metal selected from a group consisting of Aluminum (Al), Titanium (Ti), Chromium (Cr) and Molybdenum (Mo).

12. The transducer of claim 1, wherein each of the first electrode, the second electrode and the third electrode comprises doped polycrystalline silicon or single crystalline silicon.

13. The transducer of claim 6, wherein the isolator comprises a material selected from a group consisting of silicon carbide (SiC) and silicon oxide ($SiO_2$).

14. A transducer comprising:
a first electrode;
a second electrode disposed over the first electrode such that the first electrode and the second electrode form respective capacitive electrodes of a capacitor, the second electrode comprising a core portion and a peripheral portion;

a third electrode disposed relative to the second electrode such that the third electrode overlaps with the peripheral portion of the second electrode; and a piezoelectric element disposed between the peripheral portion of the second electrode and the third electrode, so as to tune a tensional force provided by the piezoelectric element onto the second electrode by varying a piezoelectric voltage applied between the second electrode and the third electrode, and wherein the core portion of the second electrode is free of any piezoelectric element.

15. A transducer, comprising:

a first electrode;

a second electrode disposed over the first electrode such that the first electrode and the second electrode form respective capacitive electrodes of a capacitor, the second electrode comprising a core portion and a peripheral portion; and a piezoelectric element disposed between the peripheral portion of the second electrode and the first electrode, so as to tune a tensional force provided by the piezoelectric element onto the second electrode by varying a piezoelectric voltage applied between the first electrode and the second electrode.

16. The transducer of claim 14, wherein the first electrode comprises a cross-sectional dimension smaller than the second electrode.

17. The transducer of claim 14, further comprising an isolator disposed between the first electrode and the second electrode.

18. The transducer of claim 17, wherein the first electrode comprises a cross-sectional dimension substantially similar to the second electrode.

19. The transducer of claim 17, wherein each of the first electrode, the second electrode and the third electrode are positioned in substantially different planes.

20. The transducer of claim 15, wherein the second electrode comprises a vibrating membrane.

* * * * *